(12) United States Patent
Perner

(10) Patent No.: US 8,780,613 B1
(45) Date of Patent: Jul. 15, 2014

(54) READING A MEMORY ELEMENT WITHIN A CROSSBAR ARRAY

(71) Applicant: Hewlett-Packard Development Company, L.P., Houston, TX (US)

(72) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/048,521

(22) Filed: Oct. 8, 2013

Related U.S. Application Data

(62) Division of application No. 12/788,161, filed on May 26, 2010, now Pat. No. 8,570,785.

(51) Int. Cl.
*G11C 11/00* (2006.01)
(52) U.S. Cl.
USPC ................. 365/148; 365/189.09; 365/210.11

(58) Field of Classification Search
USPC .......................... 365/148, 158, 163, 171, 173
See application file for complete search history.

(56) References Cited

U.S. PATENT DOCUMENTS

| | | | |
|---|---|---|---|
| 5,594,698 | A | 1/1997 | Freeman |
| 6,597,598 | B1 | 7/2003 | Tran et al. |
| 7,251,178 | B2 | 7/2007 | Gogl et al. |
| 7,372,753 | B1 | 5/2008 | Rinerson et al. |
| 7,433,253 | B2 | 10/2008 | Gogl et al. |
| 7,495,987 | B2 | 2/2009 | Boas et al. |
| 7,505,344 | B2 | 3/2009 | Scheuerlein |
| 7,535,783 | B2 | 5/2009 | DeBrosse et al. |
| 2008/0090337 | A1 | 4/2008 | Williams |
| 2009/0196087 | A1 | 8/2009 | Norman |

*Primary Examiner* — Harry W Byrne
*Assistant Examiner* — Lance Reidlinger

(57) ABSTRACT

A method for reading a memory element within a crossbar array includes switching a column line connected to a target memory element of the crossbar array to connected to an input of a current mirror; applying an error voltage to unselected rows of the crossbar array; applying a sense voltage to a row line connected to the target memory element; and outputting a current with said current mirror.

13 Claims, 6 Drawing Sheets

US 8,780,613 B1

READING A MEMORY ELEMENT WITHIN A CROSSBAR ARRAY

CROSS-REFERENCE TO RELATED APPLICATION

The present application is a divisional application of Ser. No. 12/788,161, filed on May 26, 2010, now U.S. Pat. No. 8,570,785, issued on 29 Oct. 2013, the contents of which are incorporated herein by reference.

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

As the use of digital data increases, the demand for faster, smaller, and more efficient memory structures increases. One type of memory structure which has recently been developed is a crossbar memory structure. A crossbar memory structure includes a set of upper parallel wires which intersect a set of lower parallel wires. A programmable memory element configured to store digital data is placed at each intersection of the wires.

One type of programmable memory element which may be used is a memristive element. A memristive element is a device which changes the state of its resistance based on an applied programming condition. For example, a programming condition may be applied to change the memristive element from a high resistive state to a low resistive state or vice versa. A high resistive state may represent a digital "1" and a low resistive state may represent a digital "0".

One challenge that results from use of a crossbar memory structure is the process of reading the state of a target memory element within the crossbar array. The state of a memory element may be determined by applying a sense voltage to the target memory element. Then, the electric current flowing through the target memory element will be indicative of the resistive state of the target memory element. However, when applying a sense voltage to a target memory element, the electric current flowing from the target memory element will be adversely affected by the half-selected memory elements within the crossbar array. Thus, it is difficult to isolate the electric current flowing through the target memory element that is resulting from only the applied sense voltage across the target memory element.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
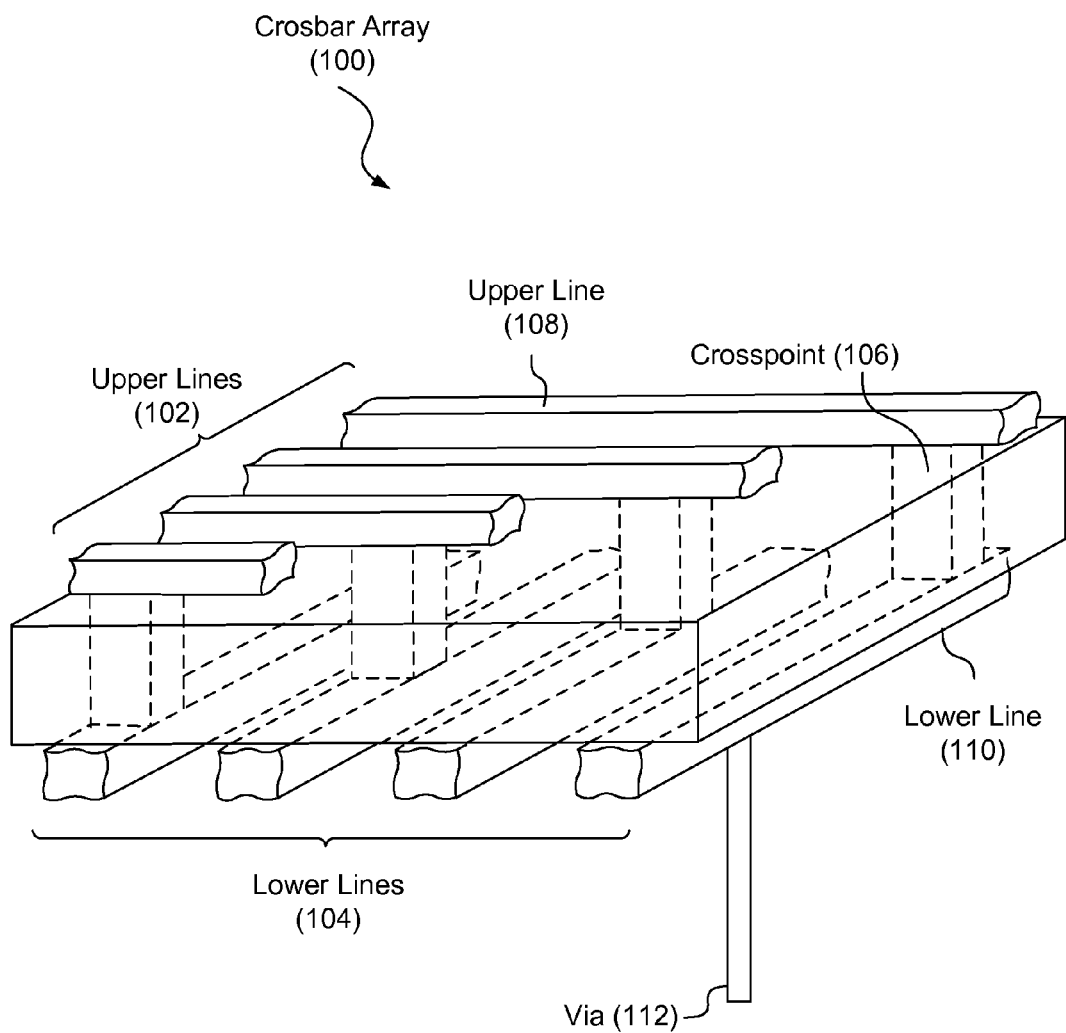
FIG. 1 is a diagram showing an illustrative crossbar array, according to one example of principles described herein.

As mentioned above, one challenge that results from use of a crossbar memory structure is the process of reading the state of a target memory element. The state of a memory element may be determined by applying a sense voltage to a target memory element. The electric current flowing through the target memory element will then be indicative of the resistive state of the target memory element. However, when applying a sense voltage to a target memory element, the electric current flowing from the target memory element will be adversely affected by the half-selected memory elements within the crossbar array. Thus, it is difficult to isolate the electric current flowing through the target memory element that is resulting from only the applied sense voltage across the target memory element.

One solution has been to use isolation elements such as diodes or transistors which may selectively inhibit the flow of electric current from unselected and half-selected memory elements. However, this approach requires the use of several additional electronic components for each memory element. The additional components prohibit the memory structure from being designed with a higher memory density. Other solutions include a two step process in which the noise current from the unselected and half-selected memory elements within the array is cancelled out. However, this method may slow down the read process as two steps are required.

In light of these and other issues, the present specification discloses a method for accurately sensing the state of a selected memory device without the need for such isolation elements or two step processes.

For purposes of illustration the two sets of intersecting parallel lines of a crossbar array will be referred to as row lines and column lines. Either the row or column lines may be the upper or lower lines.

According to certain illustrative examples, a target memory element is selected by switching a column line connected to the target memory element to a current mirror input. Additionally, a sense voltage is applied to the row line connected to the target memory element. The sense voltage will then be applied across the target memory element, causing an electric current to flow through the target memory element and to the current mirror connected to the column line. However, the electric current flowing from the target memory element will be adversely affected by other memory elements, referred to as half-selected memory elements, along the selected column line connected to the target memory element. Thus, the electric current flowing into the current mirror will not only include the electric current flowing through the target memory element, but will also include a noise current flowing through the half-selected memory elements within the crossbar array.

In order to accurately determine the resistive state of the target memory element, a substantial portion of the electric current received into the current mirror should be from the target memory element and not the half-selected memory elements within the crossbar array. To accomplish this, bias voltages are applied to the row lines not connected to the target memory element. These bias voltages may be referred to as error voltages, as they are used to reduce the error in the electric current received into the current mirror. The error voltage may be designed to be relatively equal to the output voltage of the current mirror.

With the error voltages applied to the row lines not connected to the target memory element being relatively equal to the output voltage of the current mirror, an equipotential isolation occurs. This equipotential isolation of the half-selected memory elements effectively reduces the aforementioned noise current to a negligible level. Thus, the current flowing into the current mirror will primarily include the current flowing from the target memory element. Thus, the current flowing into the current mirror will be indicative of the resistive state of the target memory element.

Through use of a system or method embodying principles described herein, the state of a target memory element within a crossbar array may be determined without the need for isolation elements. Without isolation elements, a memory structure with a higher density may be realized. The higher memory density allows more data to be stored within a smaller physical amount of space. Additionally, the read process may be performed without the need for a two-step process in which the error current is stored in a storage element. This will decrease the needed read time and increase the performance of the circuitry reading the resistive state of memory elements within the crossbar array.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "memory structure" is to be broadly interpreted as the physical structure of an electronic circuit designed to store digital data. A memory structure may include a number of programmable devices configured to be set to a number of different states.

Throughout this specification and in the appended claims, the term "crossbar array" is to be broadly interpreted as a number of lower wire lines intersecting a number of upper wire lines. A programmable logic device is disposed at each crosspoint between an upper wire segment and a lower wire segment.

Throughout this specification and in the appended claims, the term "memory element" is to be broadly interpreted as a component configured to be programmed with a value or state and maintain that value or state to be read at a later time.

Throughout this specification and in the appended claims, the terms "row lines" and "column lines" are used to differentiate between a first set of parallel lines intersecting a second set of parallel lines. Either the row or column lines may be the upper set of lines in any particular application.

Referring now to the figures, FIG. 1 is a diagram showing an illustrative crossbar memory architecture (100). According to certain illustrative examples, the crossbar architecture (100) may include an upper set of lines (102) which may generally be in parallel. Additionally, a lower set of lines (104) is generally perpendicular to, and intersects, the upper lines (102). Programmable crosspoint or memory devices (106) are formed at the intersections between an upper line (108) and a lower line (110).

According to certain illustrative examples, the programmable crosspoint devices (106) may be memristive devices. Memristive devices exhibit a "memory" of past electrical conditions. For example, a memristive device may include a matrix material which contains mobile dopants. These dopants can be moved within a matrix to dynamically alter the electrical operation of an electrical device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar architecture (100) may be used to form a non-volatile memory array. Non-volatile memory has the characteristic of not losing its contents when no power is being supplied. Each of the programmable crosspoint devices (106) is used to represent one or more bits of data. Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2:
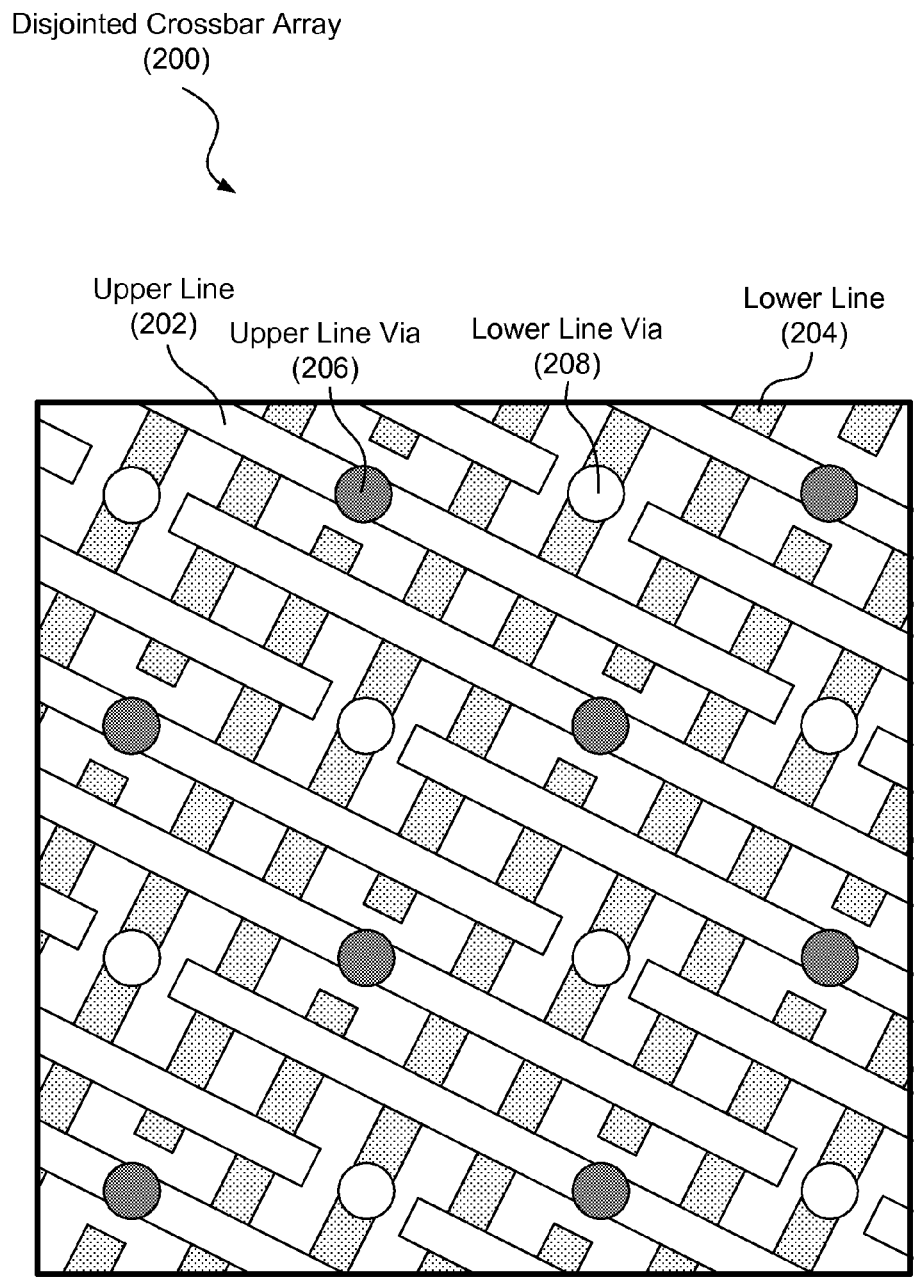
FIG. 2 is a diagram showing an illustrative disjointed crossbar array, according to one example of principles described herein.

FIG. 2 is a diagram showing an illustrative disjointed crossbar array (200). According to certain illustrative examples, a crossbar array may be structured in a disjointed manner. That is, the end crosspoints of two adjacent parallel upper lines (202) intersect different lower lines (204). In one type of disjointed crossbar array (200), the lower line vias (208) and the upper line vias (206) may each be positioned in the middle of their respective lines. Thus, the line vias (206, 208) will have an equal number of memory elements on each side. Such a crossbar structure is merely one type of crossbar structure in which the principles described herein may be used.

As mentioned above, when selecting a target memory element to be read, it is difficult to isolate the voltage which has been affected by the target memory element alone. Consequently, the present specification discloses methods and systems for reading the state of a target memory element without the need for isolation elements.

Figure 3:
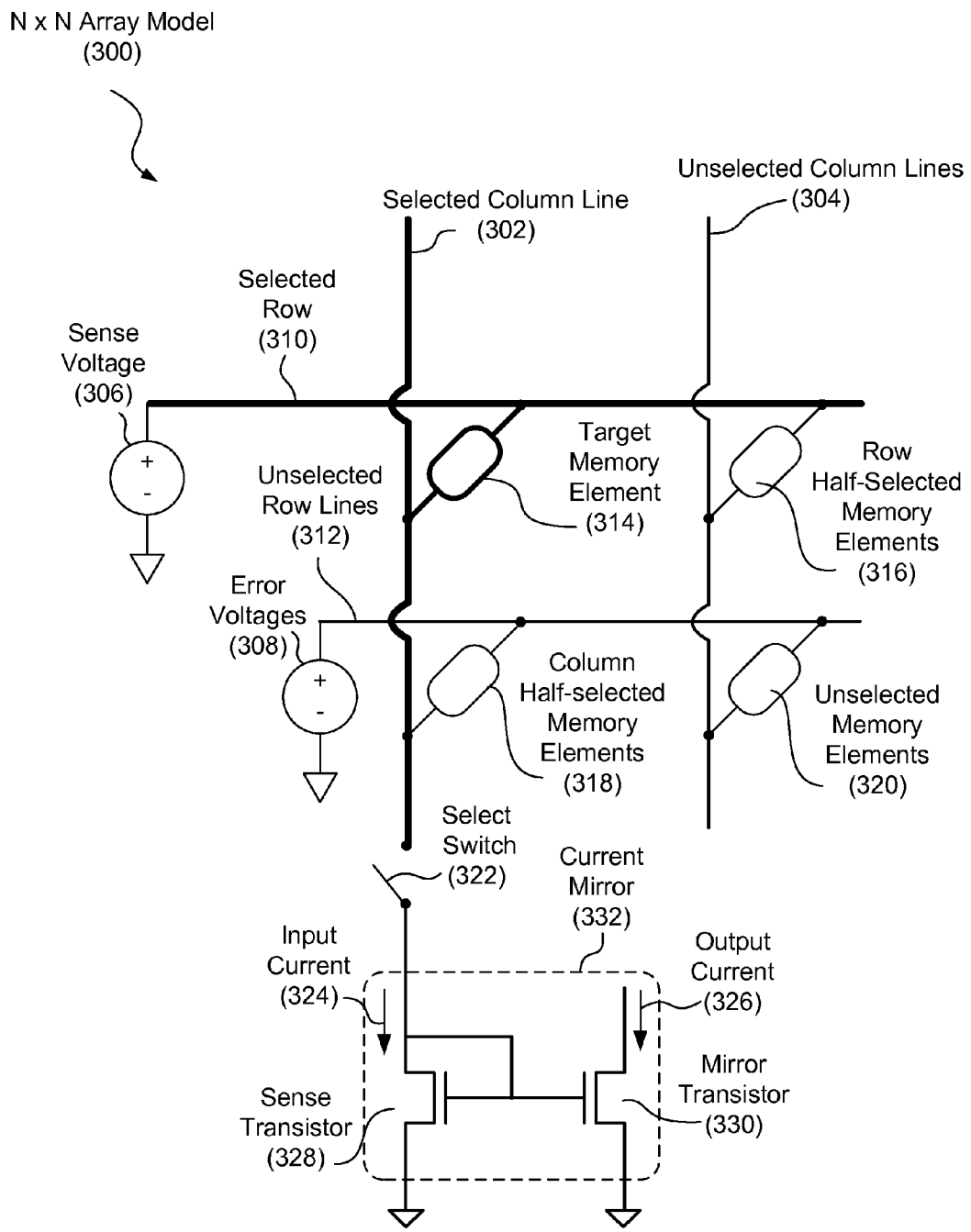
FIG. 3 is a diagram showing an illustrative model of an N×N crossbar array, according to one example of principles described herein.

FIG. 3 is a diagram showing an illustrative N×N crossbar array model. While a practical crossbar array may include a 512×512 array, a much smaller 2×2 array is shown for purposes of this explanation to more simply illustrate and model the principles of reading the state of memory elements that can be identically applied within larger arrays.

According to certain illustrative examples, a target memory element (314) is selected by switching the column line (302) connected to the target memory element (314) to a current mirror (332). This column line may be referred to as the selected column (302). A sense voltage (306) is then applied to a row line connected to the target memory element (314). This row line (310) may be referred to as the selected row (310). This will cause an electric current to flow through the target memory element (314) and into the current mirror (332). The current mirror (332) output may then be used to determine the resistive state of the target memory element (314).

The following is a detailed description of the principles at work in the circuit illustrated in FIG. 3. Particularly, the following describes the manner in which the electric current flowing from the target memory element is prevented from being adversely affected by noise currents from half-selected memory elements.

To select the column line (302) connected to the target memory element (314), a select switch (322) is used to switch the selected column line (302) to the current mirror (332) input. The select switch may be any commonly used electrical switching device such as a transistor. With the selected column line (302) switched to the current mirror (332) input, each memory element (318) along the selected column (302) becomes half-selected. The sense voltage (306) is then applied to the selected row (310). With the sense voltage (306) applied, each memory element (316) along the selected row becomes half-selected except for the target memory element (314) which becomes fully selected. The rest of the memory elements within the crossbar array (300) may be referred to as the unselected memory elements (320). The unselected memory elements (320) are connected to both unselected column lines (304) and unselected row lines (312).

With the target memory element (314) fully selected, the sense voltage (306) will be applied across the target memory element (314), causing an electric current to flow through the target memory element (314) and to the current mirror (332) input. As mentioned above, this electric current will be adversely affected by the half-selected memory elements (318) along the selected column line (302). Particularly, a voltage formed across the current mirror (332) circuit will cause a noise current to flow through the half-selected memory elements (318). This noise current will then be added to the current flowing into the current mirror (332). Thus, the input current (324) of the current mirror (332) is not an entirely accurate representation of the current flowing through the target memory element (314).

To compensate for this, error voltages (308) are applied to the unselected rows (312) of the crossbar array (300). The error voltages may be designed to match the voltage formed across the current mirror (332). This voltage formed across the current mirror may be referred to as an output voltage of the current mirror (332). By matching the error voltages to the output voltage of the current mirror (332), an equipotential isolation of the half-selected memory elements (318) occurs. This equipotential isolation, which will be described in more detail below, will effectively reduce the noise currents from the half-selected memory elements to a negligible level. Thus, the input current (324) to the current mirror (332) will not be adversely affected by the half-selected memory elements (318) beyond a negligible level.

When the input current (324) flows into the current mirror (332), it flows across a sense transistor (328). This flow of current across the sense transistor (328) creates a voltage across the sense transistor (328). This voltage is essentially the output voltage of the current mirror (332). It is this voltage that the error voltages (308) are designed to match. In accordance with Kirchhoff's Voltage Law, this voltage will also be applied across the mirror transistor (330). The voltage across the mirror transistor (330) will cause an electric current (326) to flow through the mirror transistor (330). This electric current (326) may be referred to as the output current (326).

If the physical characteristics of the mirror transistor (330) match the physical properties of the sense transistor (328), then the output current (330) will match the input current (324). In some cases, the physical characteristics of the mirror transistor (330) may be different than the physical characteristics of the sense transistor (328). This will cause the output current (330) to be a scaled value of the input current (324). The output current may thus be scaled appropriately, if desired, to suit the design of the sensing and reading circuitry used to measure the output current (326).

Sensing circuitry will then use the output current (330) of the current mirror (332) to determine the resistive state of the target memory element (314), the resistive state of the target memory element (314) being indicative of the data stored in the target memory element (314). Data is typically stored in a digital format. In a digital format, only two discrete values are represented; a digital '1' and a digital '0'. The resistive state of a memory element may represent either a '1' or a '0'. For example, a high resistive state may represent a '0' and a low resistive state may represent '1,' or vice versa In some cases, the difference between a high resistive state and a low resistive state may be a factor of 100 or more. For example, if a memory element is in a low resistive state, it may have a resistance of 100 ohms. In a high resistive state, the memory element may have a resistance of 10,000 ohms. Thus, it may not be necessary to determine the exact resistance of a target memory element. Rather, the relative resistance may be sufficient to determine whether the target memory element is representing a digital '1' or a digital '0'.

Figure 4:
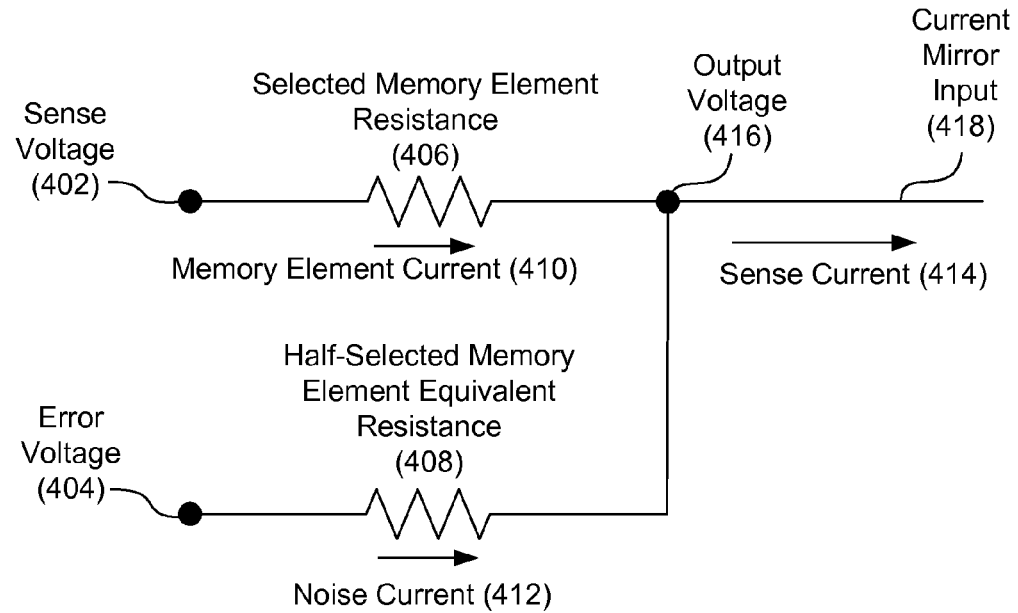
FIG. 4 is a diagram of an illustrative circuit schematic showing a current divider circuit, according to one example of principles described herein.

FIG. 4 is a diagram of an illustrative circuit schematic (400) showing a current divider circuit. The circuit schematic (400) illustrates the equivalent circuit of a selected memory element (e.g. 314, FIG. 3) and the half-selected memory elements (e.g. 318, FIG. 3) along the selected column.

The selected memory element resistance (406) represents the resistance of a fully selected memory element within a crossbar array. This resistance (406) is dependent upon the resistive state of the selected memory element. The equivalent resistance of the half-selected memory elements (408) represents the combined resistance of each half-selected memory element along the selected column (e.g. 302, FIG. 3). Together, the selected memory element resistance (406) and the half-selected memory element equivalent resistance (408) form a current divider circuit.

The electric current flowing across the selected memory element resistance (406), which may be referred to as the memory element current (410), can be expressed by the following equation:

$$I_{SEL}=(V_S-V_O)/R_{SEL} \quad \text{(Equation 1)}$$

Wherein:
$I_{SEL}$=the memory element current (410);
$V_S$=the sense voltage (402);
$V_O$=the output voltage (416); and
$R_{SEL}$=the selected memory element resistance (406).

As will be appreciated by those skilled in the relevant art, as the sense voltage (402) $V_S$ increases, the memory element current (410) $I_{SEL}$ increases as well.

The total electric current flowing through the half-selected memory element equivalent resistance (408), which may be referred to as a noise current (412), may be expressed by the following equation:

$$I_{HS}=(V_E-V_O)/R_{HS} \quad \text{(Equation 2)}$$

Wherein:
$I_{HS}$=the half-select noise current (412);
$V_E$=the error voltage (404);
$V_O$=the output voltage (416); and
$R_{HS}$=the half-selected memory element resistance (408).

As will be appreciated by those skilled in the relevant art, as the error voltage (404) $V_E$ approaches the output voltage (416) $V_O$, the noise current (412) $I_{HS}$ approaches zero. As mentioned above, the error voltage (404) is designed to match the output voltage (416). This ideally brings the noise current (412) close to zero. In practical circuits, the error voltage (404) does not completely match the output voltage (416). However, it is close enough that any resulting noise current (412) is considered negligible.

The sense current (414) is a sum of the memory element current (410) plus the noise current (412). Thus, when the noise current is minimized due to the equipotential isolation resulting from the error voltage (404) matching the output voltage (416), the sense current (414) primarily includes the memory element current (410) flowing through the target memory element. The sense current (414) is then input into a current mirror in accordance with the principles described above.

If no error voltage (404) were applied to the row lines connected to the half-selected memory elements, the output voltage (416), which results from switching the selected column line to the current mirror, would cause a substantial noise current (412) to flow through the half-selected memory elements. This noise current (412) would adversely affect the input current of the current mirror, leading to an unreliable measurement.

Figure 5:
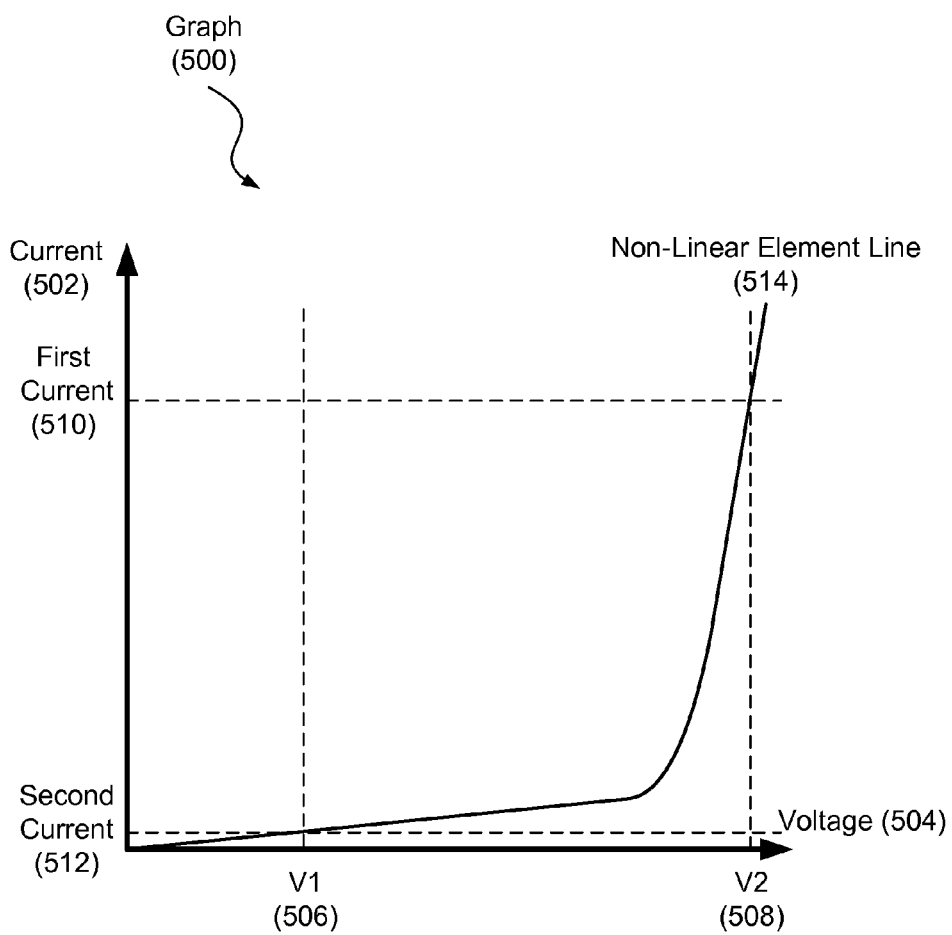
FIG. 5 is a diagram showing an illustrative voltage to current relation of a non-linear element, according to one example of principles described herein.

FIG. 5 is a graph (500) showing an illustrative voltage to current relation of a non-linear element. The horizontal axis of the graph (500) represents voltage (504) and the vertical axis of the graph (500) represents electric current (502). The non-linear element line (514) indicates the electric current (502) passing through a non-linear resistive element as a function of voltage (504).

According to certain illustrative examples, a voltage V2 (508) may be applied to a non-linear element. A first electric current (510) illustrated by the upper horizontal dotted line is the electric current value passing through the non-linear element with a voltage of V2 (508) applied. If a smaller voltage V1 (506) is applied, a second electric current (512) illustrated by the lower horizontal dotted line will flow through the non-linear element. If the second voltage is half the first voltage, then the second current (512) will be much smaller than half the first electric current (510) flowing through the non-linear element when V (508) is applied. This non-linear relationship allows error voltages to be applied to unselected row lines within the crossbar array without overly affecting the electric current sensed from a selected memory element.

For example, if a sense voltage of V2 (508) is applied to a selected line and the resulting output voltage of the current mirror is equal to V1 (506), the error voltage may be set to V1 (506), the cumulative electric currents from several unselected row lines may still be less than the electric current flowing through the target memory element as a result of sense voltage V2 (508) being applied to the row line connected to the target memory element.

Figure 6:
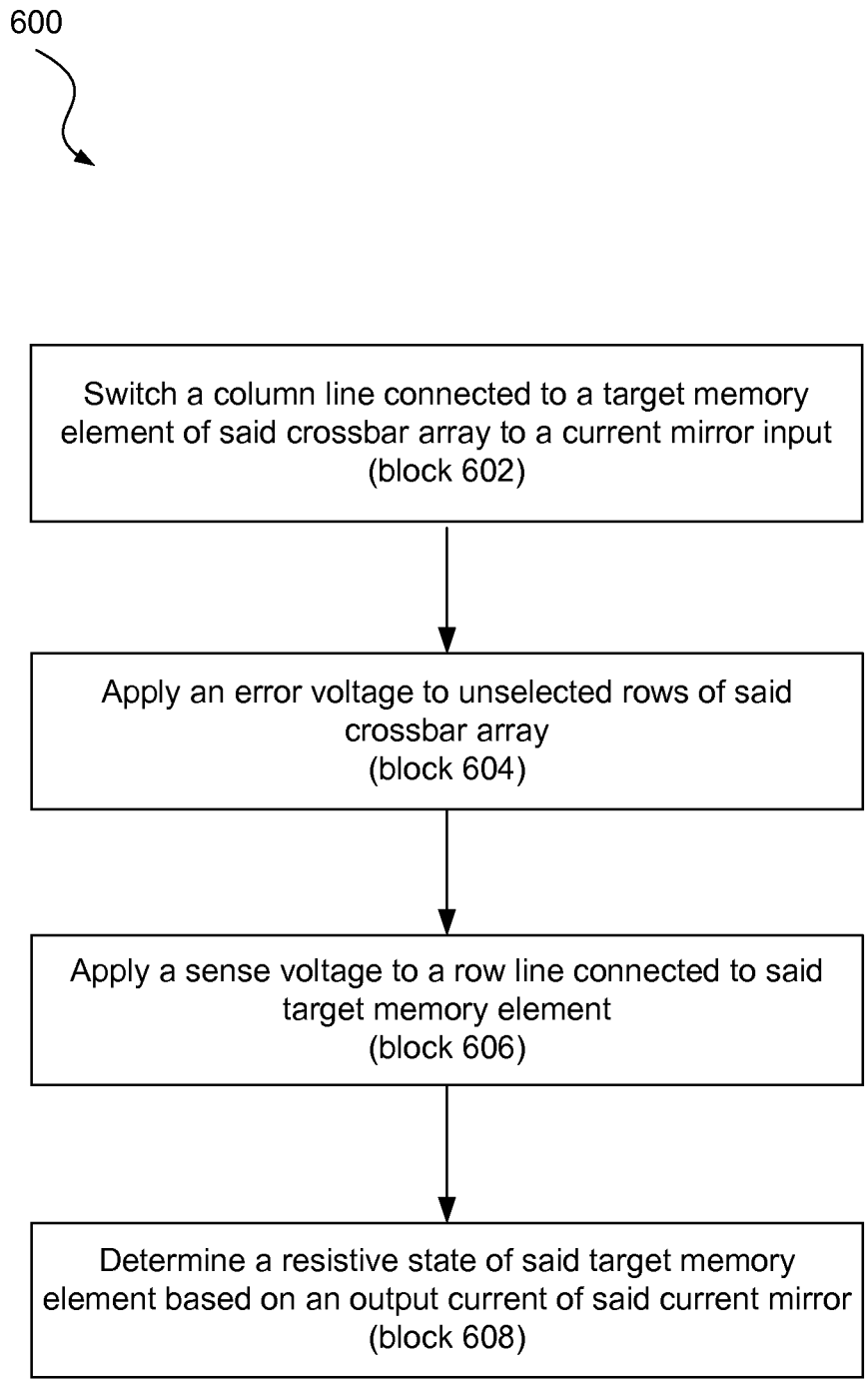
FIG. 6 is a flowchart showing an illustrative method for using a voltage to sense the state of a memory element within a crossbar array, according to one example of principles described herein.

FIG. 6 is a flowchart showing an illustrative method for sensing the resistive state of a memory element within a crossbar array. According to certain illustrative examples, the method may include switching (block 602) a column line connected to a target memory element of said crossbar array to a current mirror input; applying (block 604) an error voltage to unselected rows of said crossbar array; and applying (block 606) a sense voltage to a row line connected to said target memory element. The method may further include determining (block 608) a resistive state of said target memory element based on an output current of said current mirror.

In sum, through use of a system or method embodying principles described herein, the state of a target memory element within a crossbar array may be determined without the need for isolation elements. Without isolation elements, a memory structure with a higher density may be realized. The higher memory density allows more data to be stored within a smaller physical amount of space. Additionally, the read process may be performed without the need for a two-step process in which the error current is stored in a storage element. This will increase the read time and performance of the circuitry reading the resistive state of memory elements within the crossbar array.

The preceding description has been presented only to illustrate and describe examples and examples of the principles described. This description is not intended to be exhaustive or to limit these principles to any precise form disclosed. Many modifications and variations are possible in light of the above teaching.

What is claimed is:

1. A method for reading a memory element within a crossbar array, the method comprising:
   switching a column line connected to a target memory element of said crossbar array to connect to an input of a current mirror;
   applying an error voltage to unselected rows of said crossbar array;
   applying a sense voltage to a row line connected to said target memory element, wherein applying the sense voltage includes matching said error voltage to a voltage formed across said current mirror; and
   outputting a current with said current mirror.

2. The method of claim 1, further comprising, determining a resistive state of said target memory element based on said output current of said current mirror.

3. The method of claim 2, in which said current mirror is configured to scale said output current.

4. The method of claim 1, in which said sense voltage is designed so that an electric current flowing through said target memory element is substantially larger than a total electric current flowing through half-selected memory elements within said crossbar array.

5. The method of claim 1, in which said crossbar array is a disjointed crossbar array.

6. The method of claim 1, in which memory elements within said crossbar array comprise non-linear resistive elements.

7. The method of claim 6, in which said non-linear resistive memory elements within said crossbar array comprise memristive elements.

8. The method of claim 6, further including measuring said output current.

9. A method for reading a memory element within a crossbar array, the method comprising:
- switching a column line connected to a target memory element of said crossbar array to connect to an input of a current mirror;
- applying an error voltage to unselected rows of said crossbar array, said error voltage being matched to an output voltage of said current mirror;
- applying a sense voltage to a row line connected to said target memory element, said sense voltage causing an electric current flowing through said target memory element to be larger than a total electric current flowing through half-selected memory elements within said crossbar array; and
- determining a resistive state of said target memory element based on an output current of said current mirror.

10. The method of claim 9, in which said crossbar array is a disjointed crossbar array.

11. The method of claim 9, in which memory elements within said crossbar array comprise non-linear resistive elements.

12. The method of claim 11, in which said non-linear resistive memory elements within said crossbar array comprise memristive elements.

13. The method of claim 9, in which said current mirror is configured to scale said output current.

\* \* \* \* \*